(12) United States Patent
Hung

(10) Patent No.: US 12,454,964 B1
(45) Date of Patent: Oct. 28, 2025

(54) CASE FAN SYSTEM OF EASY ASSEMBLY AND DISASSEMBLY AND ELECTRONIC DEVICE INCLUDING THE SAME

(71) Applicant: LANNER ELECTRONICS INC., New Taipei (TW)

(72) Inventor: Shih-Tai Hung, New Taipei (TW)

(73) Assignee: LANNER ELECTRONICS INC., New Taipei (TW)

( * ) Notice: Subject to any disclaimer, the term of this patent is extended or adjusted under 35 U.S.C. 154(b) by 0 days.

(21) Appl. No.: 19/213,132

(22) Filed: May 20, 2025

(30) Foreign Application Priority Data

Jan. 3, 2025 (TW) ................. 114100201

(51) Int. Cl.
*H05K 7/20* (2006.01)
*F04D 25/16* (2006.01)
*F04D 29/52* (2006.01)
*F04D 29/64* (2006.01)

(52) U.S. Cl.
CPC ......... *F04D 29/646* (2013.01); *F04D 25/166* (2013.01); *F04D 29/522* (2013.01); *H05K 7/20172* (2013.01)

(58) Field of Classification Search
CPC ...... H05K 7/20172; F04D 29/646; G06F 1/20
See application file for complete search history.

(56) References Cited

U.S. PATENT DOCUMENTS

| | | | | |
|---|---|---|---|---|
| 7,522,415 B2 * | 4/2009 | Fan | ..................... | H05K 7/20172 312/236 |
| 7,545,641 B2 * | 6/2009 | Chen | .................. | H05K 7/20727 361/679.48 |
| 8,075,248 B2 * | 12/2011 | Yin | ..................... | H05K 7/20172 415/214.1 |
| 8,373,989 B2 * | 2/2013 | Gong | ................. | H05K 7/20172 361/679.48 |
| 9,063,709 B2 * | 6/2015 | Ma | ...................... | H05K 7/20172 |
| 10,802,553 B1 * | 10/2020 | Chang | ..................... | G06F 1/184 |
| 2013/0156597 A1 * | 6/2013 | Sun | ..................... | H05K 7/20172 416/244 R |
| 2021/0148381 A1 * | 5/2021 | Hsu | ......................... | F04D 9/002 |

FOREIGN PATENT DOCUMENTS

CN        119225490 A  *  12/2024  ............. G06F 1/183

* cited by examiner

*Primary Examiner* — Justin D Seabe

(57) ABSTRACT

A case fan system of easy assembly and disassembly is disclosed, wherein comprises a mounting plate and a plurality of fan modules, wherein the mounting plate is disposed in a housing case of an electronic device, and each said fan module consists of a case fan, an enclosing member and at least one fixing member. Specifically, the enclosing member surrounds the case fan, and is attached onto the mounting plate via the at least one fixing member. By such designs, it is able to disassemble the fan module from the mounting plate easily, thereby making the internal of the housing case to free up extra spaces. On the contrary, it is also able to attach, in case of one or more extra electronic chips/modules being added into the housing case, one or more said fan module onto the mounting plate, thereby enhancing the efficiency of hot air discharging.

15 Claims, 5 Drawing Sheets

CASE FAN SYSTEM OF EASY ASSEMBLY AND DISASSEMBLY AND ELECTRONIC DEVICE INCLUDING THE SAME

CROSS-REFERENCE TO RELATED APPLICATIONS

This application claims the priority and benefit of Taiwan patent application No. 114100201, filed on Jan. 3, 2025, the entire contents of which are incorporated herein by reference.

BACKGROUND OF THE INVENTION

1. Field of the Invention

The present invention relates to the technology filed of heat dissipation systems, and more particularly, to a case fan system of easy assembly and disassembly for application in an electronic device.

2. Description of the Prior Art

It is known that there are a variety of computer systems developed so as to be launched on the market, including desktop computer, laptop computer, all-in-one computer, industrial computer, server computer, and video game console. In addition, it is also aware of that the computer system is provided with at least one heat dissipation device (or called as cooling device) therewithin, so as to assist in cooling down the working temperature of the electronic chip like CPU and the at least one electronic module including solid-state drive. For example, a traditional heat dissipation device comprises a heat conductive block, a heat sink and a cooling fan, of which the heat conductive block is disposed on a heat source such as CUP or GPU, the heat sink is stacked on the heat conductive block, and the cooling fan disposed on a plurality of plate fins of the heat sink. When working normally, heat generated by the heat source is transferred to a base of the heat sink, and is subsequently transferred to the plurality of plate fins. Consequently, heat exchange conducted between the plate fins and the environment air leads the heat source's (e.g., CPU) working temperature to be cooled down. In addition, controlling the cooling fan to operate by a specific fan blade rotation speed is further helpful in enhancing a whole heat dissipation efficiency of the traditional heat dissipation device.

The above-mentioned cooling fan in connection with the heat sink is also called as CPU fan or GPU fan. In addition, there are commonly at least one cooling fan fixed on a chassis of the computer system like desktop computer, and this type of cooling fan is usually called as case fan. For this reason, in development stage of a new type of computer system, there is a need for mechanical engineers to design so as to dispose a predetermined number of case fan fixing mechanisms in a chassis of the new model of computer system. For instance, mounting bracket is one kind of the case fan fixing mechanism, and is disposed, by the mechanical engineers, in the chassis of the new model of computer system by the predetermined number.

According to practical experience, several different models of computer systems' chassis may have the same size and shape, but these different models of computer systems' configurations and specification are not identical. In this case, any two different models of computer systems would be commonly disposed with the case fans in the chassis thereof by different predetermined number, such that corresponding numbers of the mounting brackets are also disposed in the chassis, resulting in that the internal space of the chassis is unable to be fully utilized with flexibility.

According to above descriptions, it is easily understood that there is a room for improvement in the conventional way of disposing case fans in computer chassis. In view of that, inventors of the present application have made great efforts to make inventive research and eventually provided a case fan system of easy assembly and disassembly for application in an electronic device.

SUMMARY OF THE INVENTION

The primary objective of the present invention is to provide a case fan system of easy assembly and disassembly, which comprise a mounting plate and a plurality of fan modules, wherein the mounting plate is disposed in a housing case of an electronic device, and each said fan module consists of a case fan, an enclosing member and at least one fixing member. Specifically, the enclosing member surrounds the case fan, and is attached onto the mounting plate via the at least one fixing member. By such designs, it is able to disassemble the fan module from the mounting plate easily, thereby making the internal of the housing case to free up extra spaces. On the contrary, it is also able to attach, in case of one or more extra electronic chips/modules being added into the housing case, one or more said fan module onto the mounting plate, thereby enhancing the efficiency of hot air discharging.

In order to achieve the aforementioned objective, one embodiment of the case fan system of easy assembly and disassembly is provided, which comprises:
  a mounting plate, being disposed in a housing case of the electronic device, and being provided with a plurality of connection holes thereon; and
  a plurality of fan modules, being disposed on the mounting plate, and comprising:
  an enclosing member;
  a cooling fan, being disposed on the enclosing member; and
  N numbers of fixing members, being disposed in the enclosing member, and each said fixing member comprises a fixing part and a pin;
  wherein N is a positive integer, and each said pin downwardly pass through the enclosing member so as to insert into one said connection hole correspondingly;
  wherein the housing case is provided with a plurality of vent holes thereon, such that a rear side and a front side of the cooling fan face the plurality of vent holes and an internal space of the housing case, respectively.

In one embodiment, the enclosing member comprises:
  a base, consisting of a bottom plate, a front plate and a rear plate; and
  a cover plate, being connected to a top side of the front plate and a top side of the rear plate;
  wherein the cooling fan is disposed on the bottom plate, such that the front plate and the rear plate face and approach the front side and the rear side of the cooling fan, respectively.

In one embodiment, the top side of the front plate is bent so as to form a first extension segment, and the first extension segment is provided with at least one first screw hole thereon.

In one embodiment, the top side of the rear plate is bent so as to form a second extension segment, and the second extension segment is provided with at least one second screw hole thereon.

In one embodiment, the bottom plate is provided with N numbers of through hole.

In one embodiment, the fixing part comprises:
an upper plate, being connected to a top surface of the bottom plate;
a connection block, being connected to the upper plate, and being embedded in one said through hole correspondingly; and
a lower plate, being connected to the connection block, and approaching the bottom surface of the bottom plate.

In one embodiment, one side of the pin is disposed with a protrusion block thereon, such that the protrusion block upwardly withstands a bottom plate of the mounting plate after the pin is inserted into the connection hole.

In one embodiment, there are at least one third screw hole corresponding to the at least one first screw hole and at least one fourth screw hole corresponding to the at least one second screw hole formed on the cover plate.

In one embodiment, the front side and the rear side of the cooling fan are provided with at least one fifth screw hole and at least one sixth screw hole thereon, respectively.

In one embodiment, there is at least one seventh screw hole corresponding to the at least one fifth screw hole provided on the front plate, and at least one eighth screw hole corresponding to the at least one sixth screw hole is formed on the rear plate.

In one embodiment, the front plate is further provided with a notch and a plurality of first vent hole thereon.

In one embodiment, the rear plate is further provided with a plurality of second vent hole thereon.

In one optional embodiment, the case fan system further comprises:
at least one spacing member, being disposed on the mounting plate;
wherein each said spacing member stays between two said fan modules, or being positioned between one said fan module and one object that is accommodated in the housing case.

Moreover, an embodiment of an electronic device is also provided, which comprises:
a housing case;
at least one electronic device accommodated in the housing case;
at least one electronic module accommodated in the housing case; and
the case fan system according to claim 1, being disposed in the housing case.

In one embodiment, the electronic device is selected from a group consisting of server computer, Ethernet switch, Ethernet gateway, embedded computer, single board computer, industrial computer, desktop computer, all-in-one computer, on-board computer, host computer of security surveillance system, video game console, and host computer of arcade game machine.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a case fan system of easy assembly and disassembly according to the present invention, embodiments of the present invention will be described in detail with reference to the attached drawings hereinafter.

Figure 1:
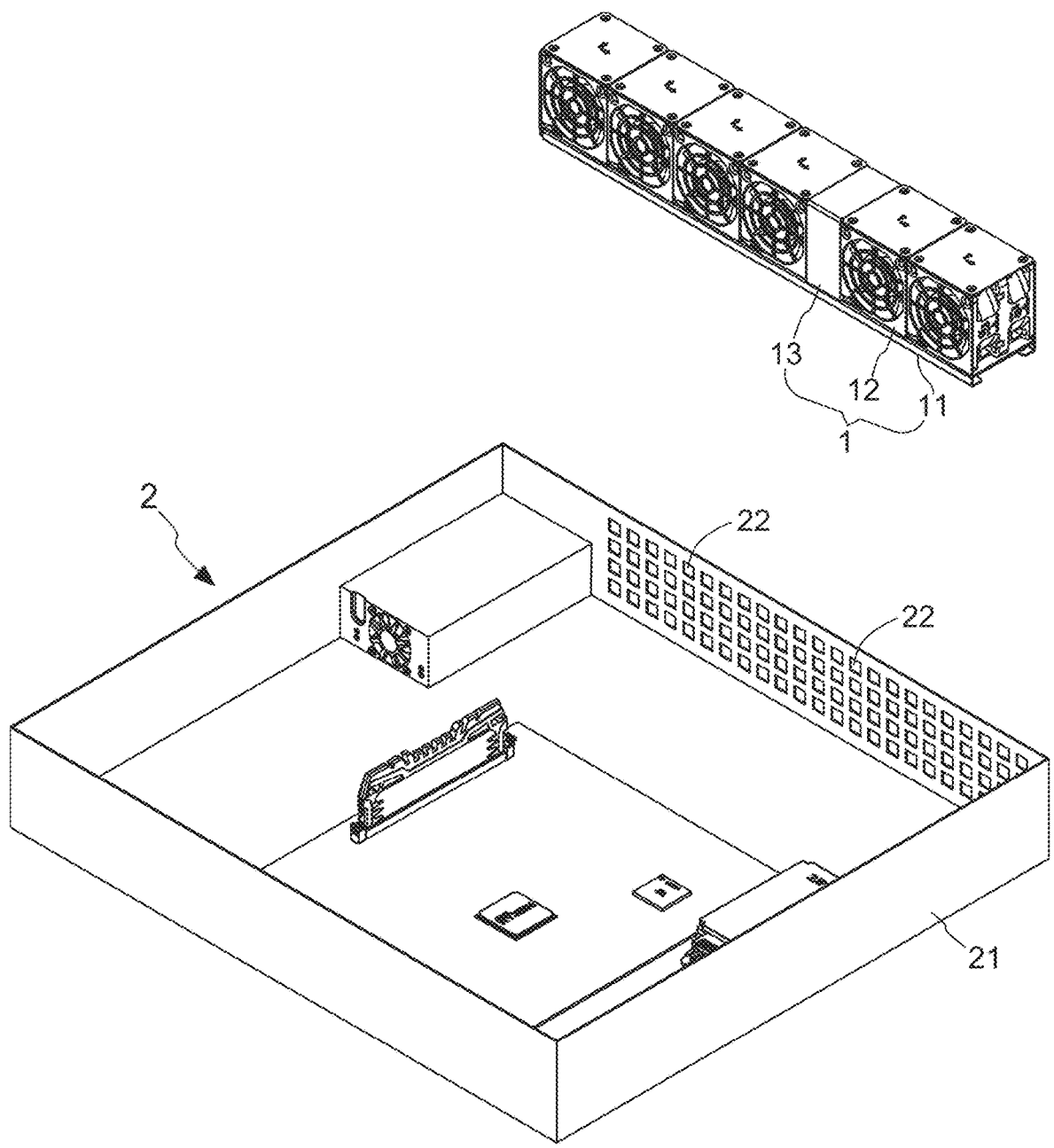
FIG. 1 shows a stereo diagram of an electronic device including a case fan system of easy assembly and disassembly according to the present invention.

With reference to FIG. 1, there is illustrated a stereo diagram of an electronic device including a case fan system of easy assembly and disassembly according to the present invention. As FIG. 1 shows, the case fan system 1 of easy assembly and disassembly according to the present invention is adapted for integration in an electronic device 2, wherein the electronic device 2 comprises a housing case 21 provided with a plurality of vent holes 22 thereon, and at least one electronic chip and at least one electronic module are accommodated in the housing case 21. In any practicable embodiments, the electronic device 2 can be, but is not limited to server computer, Ethernet switch, Ethernet gateway, embedded computer, single board computer, industrial computer, desktop computer, all-in-one computer, on-board computer, host computer of security surveillance system, video game console, and host computer of arcade game machine.

Figure 2A:
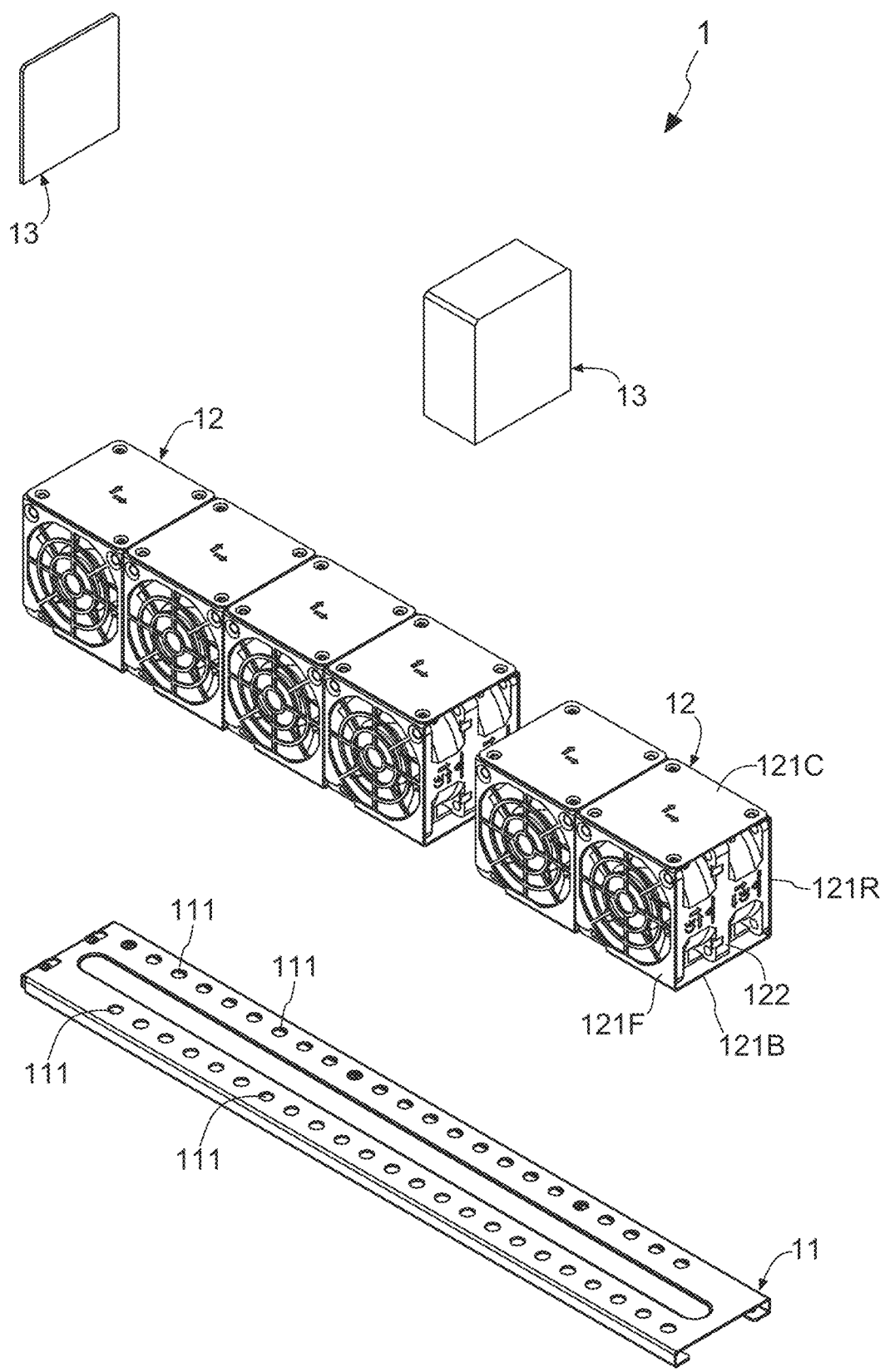
FIG. 2A shows a first exploded view of the case fan system according to the present invention.
Figure 2B:
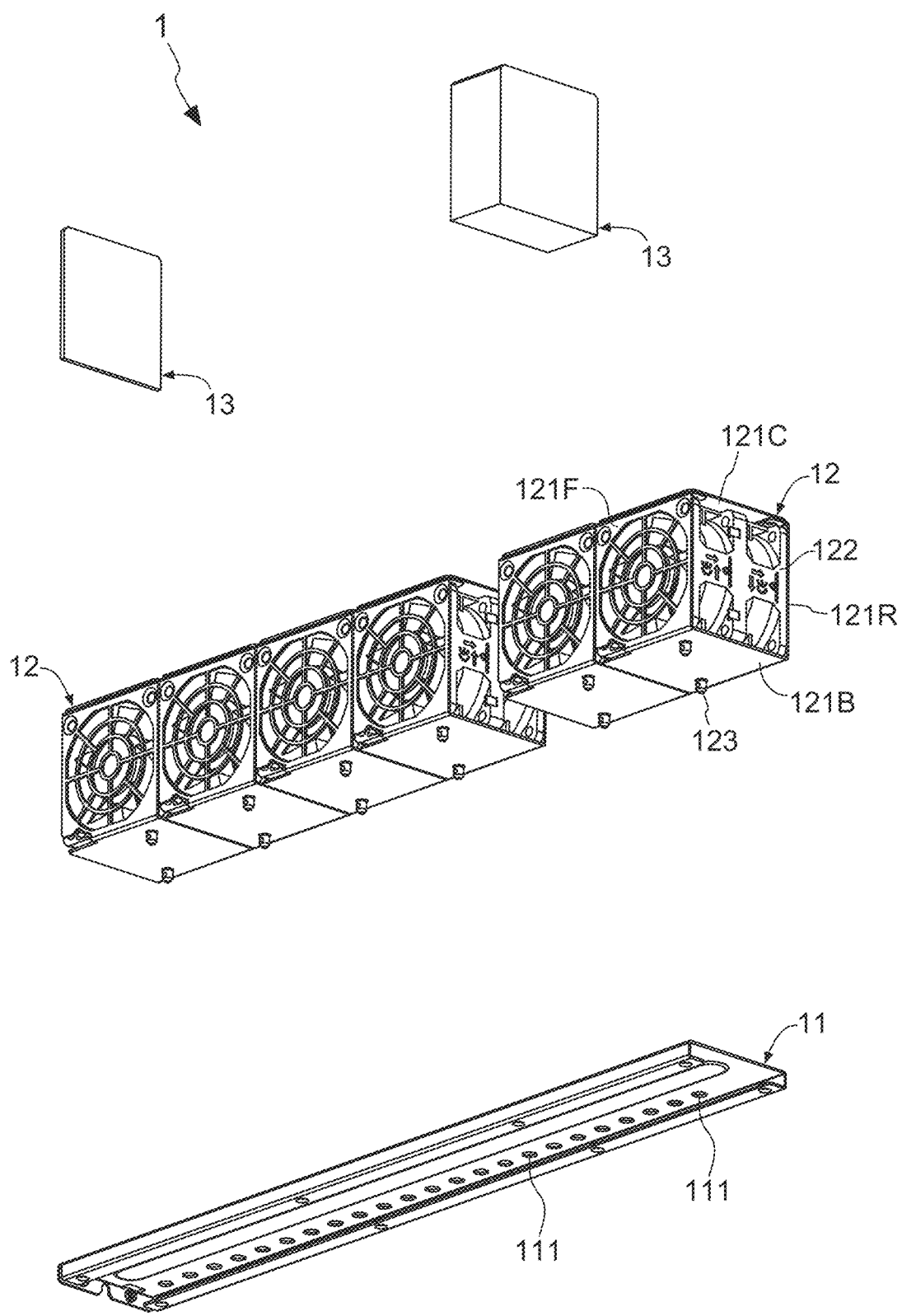
FIG. 2B shows a second exploded view of the case fan system according to the present invention.

Furthermore, FIG. 2A and FIG. 2B illustrate a first exploded view and a second exploded view of the case fan system 1 according to the present invention, respectively. As FIG. 1, FIG. 2A and FIG. 2B show, the case fan system 1 principally comprises a mounting plate 11 and a plurality of fan modules 12, of which the mounting plate 11 is disposed in the housing case 21 of the electronic device 2, and is provided with a plurality of connection holes 111 thereon. Moreover, the plurality of fan modules 12 are disposed on the mounting plate 11, and comprises an enclosing member 121, a cooling fan 122 and N numbers of fixing members 123, wherein the cooling fan 122 is disposed on the enclosing member 121, and the N numbers of fixing members 123 are disposed in the enclosing member 121.

Figure 3:
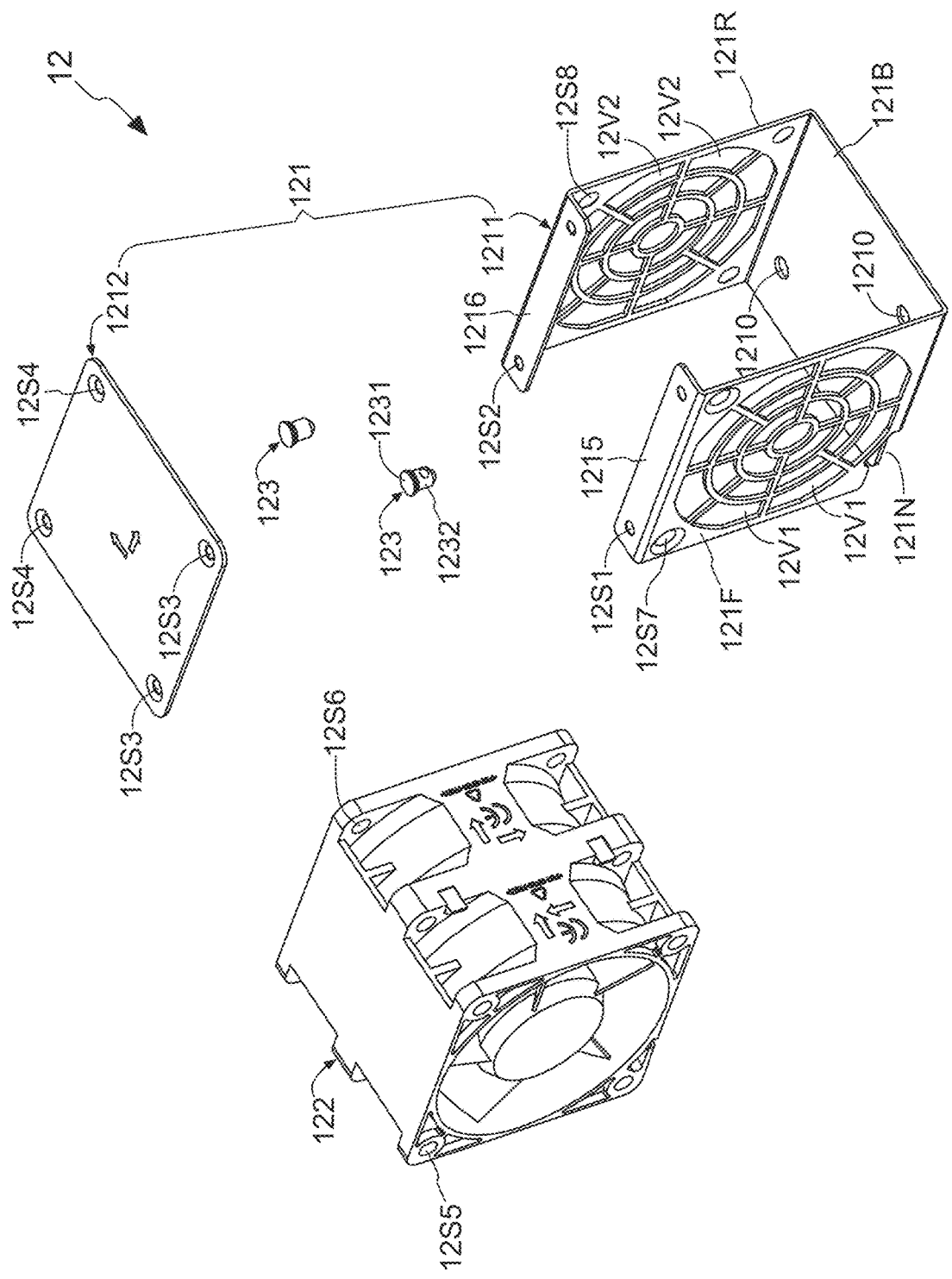
FIG. 3 shows an exploded view of one fan module of the case fan system according to the present invention.

FIG. 3 illustrate an exploded view of one fan module of the case fan system according to the present invention. As FIG. 1, FIG. 2A, FIG. 2B. and FIG. 3 show, N is a positive integer, and each said fixing member 123 comprises a fixing part 1231 and a pin 1232. Moreover, each said pin 1232 downwardly pass through the enclosing member 121 so as to insert into one said connection hole 111 correspondingly. To be more specific, the enclosing member 121 comprises a base 1211 and a cover plate 1212, of which the base 1211 consists of a bottom plate 121B, a front plate 121F and a rear plate 121R, and the cover plate 1212 is connected to a top side of the front plate 121F and a top side of the rear plate 121R. As described in more detail below, the cooling fan 122 is disposed on the bottom plate 121B, such that the front plate 121F and the rear plate 121R face and approach a front side and a rear side of the cooling fan 122, respectively.

Figure 4:
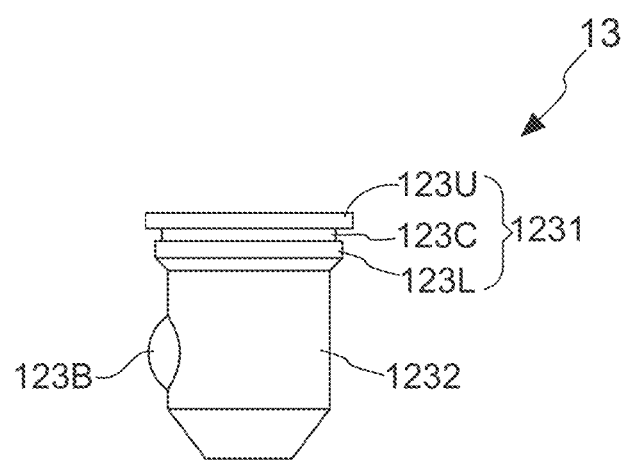
FIG. 4 shows a stereo diagram of one fixing member of the fan module.

FIG. 4 illustrates a stereo diagram of one fixing member of the fan module. As FIG. 1, FIG. 2A, FIG. 2B, FIG. 3, and FIG. 4 show, the bottom plate 121B is provided with N numbers of through hole 1210. Moreover, the fixing part 1231 of the fixing member 123 consists of an upper plate 123U, a connection block 123C and a lower plate 123L, wherein the upper plate 123U is connected to a top surface of the bottom plate 121B, and the connection block 123C is connected to the upper plate 123U, and is embedded in one said through hole 1210 correspondingly. On the other hand, the lower plate 123L is connected to the connection block 123C, and approaches the bottom surface of the bottom plate 121B.

It is worth noting that one side of the pin 1232 is disposed with a protrusion block 123B thereon, such that the protrusion block 123B upwardly withstands a bottom plate of the mounting plate 11 after the pin 1232 is inserted into the connection hole 111. To be more specific, after the case fan system 1 is disposed in the housing case 21 of the electronic device 2, the rear side and the front side of the cooling fan 122 face the plurality of vent holes 22 and an internal space of the housing case 21, respectively. Moreover, it is worth further explaining that a predetermined number of the through holes 1210 is "2" in a preferred embodiment, and the two through holes 1210 formed on the bottom plate 121B of the enclosing member 121 are diagonally face to each other. Correspondingly, a predetermined number of the fixing member 123 of the fan module 12 is also "2". In addition, the plurality of connection holes 111 with reference to FIG. 2A are lined up in two rows including an upper low and a lower low, in which each of the two rows all consist of L numbers of the connection holes 111. Furthermore, it is aware of that first connection hole 111 in the lower low is opposite to second connection hole 111 in the upper low, and L-th connection hole 111 in the upper low is opposite to (L−1)-th connection hole 111 in the lower low. Briefly speaking, in the two rows of connection holes 111, i-th connection hole 111 in the upper low is opposite to i-th connection hole 111 in the lower low diagonally, wherein i and L are both positive integers, and the maximum value of i is equal to L.

As described in more detail below, the top side of the front plate 121F is bent so as to form a first extension segment 1215, and the first extension segment 1215 is provided with at least one first screw hole 12S1 thereon. Similarly, the top side of the rear plate 121R is bent so as to form a second extension segment 1216, and the second extension segment 1216 is provided with at least one second screw hole 12S2 thereon. Moreover, there are at least one third screw hole 12S3 corresponding to the at least one first screw hole 12S1 and at least one fourth screw hole 12S4 corresponding to the at least one second screw hole 12S2 formed on the cover plate 1212. Therefore, after the cover plate 1212 is stacked on the top side of the front plate 121F and the top side of the rear plate 121R, one fastener can be adapted for being screwed into the third screw hole 12S3 and the first screw hole 12S1 in turns, and another one fastener can also be adapted so as to be screwed into the fourth screw hole 12S4 and the second screw hole 12S2 sequentially, thereby making the connection between the base 1211 and the cover plate 1212 be tight.

On the other hand, the front side and the rear side of the cooling fan 122 are provided with at least one fifth screw hole 12S5 and at least one sixth screw hole 12S6 thereon, respectively. Moreover, there is at least one seventh screw hole 12S7 corresponding to the at least one fifth screw hole 12S5 provided on the front plate 121F, and at least one eighth screw hole 12S8 corresponding to the at least one sixth screw hole 12S6 is formed on the rear plate 121R. Therefore, after the cooling fan 122 is disposed in the base 1211, one fastener can be adapted for being screwed into the seventh screw hole 12S7 and the fifth screw hole 12S5 in turns, and another one fastener can also be adapted so as to be screwed into the eighth screw hole 12S8 and the sixth screw hole 12S6 sequentially, thereby making the connection between the base 1211 and the cooling fan 122 be tight.

It can be further noticeable that the front plate 121F is further provided with a notch 121N and a plurality of first vent hole 12V1 thereon, and the rear plate 121R is further provided with a plurality of second vent hole 12V2 thereon. It is not difficult to understand that, the notch 121N is an error proofing design for facilitating the recognition of the front plate 121F of the enclosing member 121, thereby making user assembly the cooling fan 122 in the enclosing member 121 correctly and quickly.

With reference to FIG. 1, FIG. 2A and FIG. 2B, user is able to load one or more said fan modules 12 onto the mounting plate 11, so as to enhance the flow rate of thermal air exhausting. On the contrary, user can also unload one or more said fan modules 12 from the mounting plate 11, thereby making the housing case 21 have more free and utilizable space. Meanwhile, one or more spacing members 13 can be disposed on the mounting plate 11, so as to make each said spacing member 13 stay between two said fan modules 12, or be positioned between one said fan module 12 and one object that is accommodated in the housing case 21.

Therefore, in above descriptions, the case fan system of easy assembly and disassembly according to the present invention has been introduced completely and clearly. To be particularly emphasized that, the above description is made on embodiments of the present invention. However, the embodiments are not intended to limit scope of the present invention, and all equivalent implementations or alterations within the spirit of the present invention still fall within the scope of the present invention.

What is claimed is:

1. A case fan system of easy assembly and disassembly, being adapted for integration in an electronic device, and comprising:
   a mounting plate, being disposed in a housing case of the electronic device, and being provided with a plurality of connection holes thereon; and
   a plurality of fan modules, being disposed on the mounting plate, and comprising:
   an enclosing member;
   a cooling fan, being disposed on the enclosing member; and
   N numbers of fixing members, being disposed in the enclosing member, and each said fixing member comprises a fixing part and a pin;
   wherein N is a positive integer, and each said pin downwardly pass through the enclosing member so as to insert into one said connection hole correspondingly;
   wherein the housing case is provided with a plurality of vent holes thereon, such that a rear side and a front side of the cooling fan face the plurality of vent holes and an internal space of the housing case, respectively.

2. The case fan system of claim 1, wherein the enclosing member comprises:
   a base, consisting of a bottom plate, a front plate and a rear plate; and
   a cover plate, being connected to a top side of the front plate and a top side of the rear plate;
   wherein the cooling fan is disposed on the bottom plate, such that the front plate and the rear plate face and approach the front side and the rear side of the cooling fan, respectively.

3. The case fan system of claim 2, wherein the top side of the front plate is bent so as to form a first extension segment, and the first extension segment is provided with at least one first screw hole thereon.

4. The case fan system of claim 3, wherein the top side of the rear plate is bent so as to form a second extension segment, and the second extension segment is provided with at least one second screw hole thereon.

5. The case fan system of claim 3, wherein the bottom plate is provided with N numbers of through hole.

6. The case fan system of claim 5, wherein the fixing part comprises:
- an upper plate, being connected to a top surface of the bottom plate;
- a connection block, being connected to the upper plate, and being embedded in one said through hole correspondingly; and
- a lower plate, being connected to the connection block, and approaching the bottom surface of the bottom plate.

7. The case fan system of claim 5, wherein one side of the pin is disposed with a protrusion block thereon, such that the protrusion block upwardly withstands a bottom plate of the mounting plate after the pin is inserted into the connection hole.

8. The case fan system of claim 4, wherein there are at least one third screw hole corresponding to the at least one first screw hole and at least one fourth screw hole corresponding to the at least one second screw hole formed on the cover plate.

9. The case fan system of claim 8, wherein the front side and the rear side of the cooling fan are provided with at least one fifth screw hole and at least one sixth screw hole thereon, respectively.

10. The case fan system of claim 9, wherein there is at least one seventh screw hole corresponding to the at least one fifth screw hole provided on the front plate, and at least one eighth screw hole corresponding to the at least one sixth screw hole is formed on the rear plate.

11. The case fan system of claim 8, wherein the front plate is further provided with a notch and a plurality of first vent hole thereon.

12. The case fan system of claim 11, wherein the rear plate is further provided with a plurality of second vent hole thereon.

13. The case fan system of claim 11, further comprising:
- at least one spacing member, being disposed on the mounting plate;
- wherein each said spacing member stays between two said fan modules, or being positioned between one said fan module and one object that is accommodated in the housing case.

14. An electronic device, comprising
- a housing case;
- at least one electronic device accommodated in the housing case;
- at least one electronic module accommodated in the housing case; and
- the case fan system according to claim 1, being disposed in the housing case.

15. The electronic device of claim 14, wherein the electronic device is selected from a group consisting of server computer, Ethernet switch, Ethernet gateway, embedded computer, single board computer, industrial computer, desktop computer, all-in-one computer, on-board computer, host computer of security surveillance system, video game console, and host computer of arcade game machine.

* * * * *